(12) United States Patent
Zeng et al.

(10) Patent No.: US 10,690,739 B2
(45) Date of Patent: Jun. 23, 2020

(54) MRI RF PULSE SEQUENCE FOR MULTIDIMENSIONAL OUTER VOLUME SUPPRESSION

(71) Applicant: The Board of Trustees of the Leland Stanford Junior University, Palo Alto, CA (US)

(72) Inventors: David Y Zeng, Stanford, CA (US); Dwight G Nishimura, Palo Alto, CA (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 588 days.

(21) Appl. No.: 15/482,659

(22) Filed: Apr. 7, 2017

(65) Prior Publication Data

US 2018/0292489 A1 Oct. 11, 2018

(51) Int. Cl.
*G01R 33/483* (2006.01)
*G01R 33/56* (2006.01)
*G01R 33/561* (2006.01)

(52) U.S. Cl.
CPC ..... *G01R 33/4838* (2013.01); *G01R 33/5602* (2013.01); *G01R 33/5617* (2013.01)

(58) Field of Classification Search
CPC ............ G01R 33/4816; G01R 33/4818; G01R 33/482; G01R 33/4822; G01R 33/4824;
(Continued)

(56) References Cited

U.S. PATENT DOCUMENTS

| 5,124,650 | A | * | 6/1992 | Granot | ................. | G01R 33/483 324/309 |
| 7,492,153 | B2 | | 2/2009 | Brau | | |

(Continued)

OTHER PUBLICATIONS

Doddrell DM, Brooks WM, Bulsing JM, Field J, Irving MG, Baddeley H. Spatial and chemical-shift-encoded excitation. Space, a new technique for volume-selected NMR spectroscopy. J. Magn. Reson. 1986;68(2):367-372.
(Continued)

*Primary Examiner* — Tung X Nguyen
*Assistant Examiner* — Robert P Alejnikov, Jr.
(74) *Attorney, Agent, or Firm* — Lumen Patent Firm

(57) ABSTRACT

A magnetic resonance imaging (MRI) techniques uses a T2-preparation outer volume suppression (OVS) pulse sequence to reduce the longitudinal magnetization outside a region of interest. A region is excited that includes the region of interest, radiofrequency (RF) signals are detected, and MRI images generated from the RF detected signals. The T2-preparation OVS pulse sequence includes, sequentially: a first tip-down excitation pulse, a first refocusing excitation pulse, a first tip-up excitation pulse that is selective spatially and/or spectrally, a second tip-down excitation pulse that is 180° out of phase with respect to the first tip-down excitation pulse, a second refocusing excitation pulse, and a second tip-up excitation pulse that is selective spatially and/or spectrally. Alternatively, the first tip-down excitation pulse is selective spatially and/or spectrally instead of the first tip-up excitation pulse, and the second tip-down excitation pulse is selective spatially and/or spectrally instead of the second tip-up excitation pulse.

3 Claims, 7 Drawing Sheets

(58) Field of Classification Search
CPC ............ G01R 33/4826; G01R 33/4828; G01R 33/483; G01R 33/4831; G01R 33/4833; G01R 33/4835; G01R 33/4836; G01R 33/4838; G01R 33/5602; G01R 33/5617
USPC ........................................................ 324/309
See application file for complete search history.

(56) References Cited

U.S. PATENT DOCUMENTS

| | | | | |
|---|---|---|---|---|
| 9,739,861 | B2* | 8/2017 | Smith | G01R 33/56 |
| 2006/0284615 | A1* | 12/2006 | Nazafat | G01R 33/5635 |
| | | | | 324/307 |
| 2009/0230958 | A1 | 9/2009 | Balchandani | |
| 2012/0194186 | A1* | 8/2012 | Rehwald | G01R 33/50 |
| | | | | 324/309 |
| 2013/0278258 | A1 | 10/2013 | Smith | |
| 2014/0043025 | A1* | 2/2014 | Wang | G01R 33/56316 |
| | | | | 324/309 |
| 2015/0177350 | A1* | 6/2015 | Warntjes | G01R 33/50 |
| | | | | 324/309 |
| 2015/0268318 | A1* | 9/2015 | Blumhagen | G01R 33/4828 |
| | | | | 324/309 |

OTHER PUBLICATIONS

Luyten PR, den Hollander JA. Observation of metabolites in the human brain by MR spectroscopy. Radiology. 1986;161(3):795-8.

Coristine AJ, van Heeswijk RB, Stuber M. Combined T2-preparation and two-dimensional pencil-beam inner volume selection. Magn. Reson. Med. 2015;74(2):529-536.

Luo J, Addy NO, Ingle RR, Hargreaves BA, Hu BS, Nishimura DG, Shin T. Combined outer volume suppression and T2 preparation sequence for coronary angiography. Magn. Reson. Med. 2015;74(6):1632-1639.

* cited by examiner

150 Apply a T2-preparation OVS pulse sequence to reduce the longitudinal magnetization outside a region of interest 152 Excite a region that includes the region of interest 154 Detect the radiofrequency (RF) signals 156 Generate MRI images from the RF detected signals

Fig. 2A
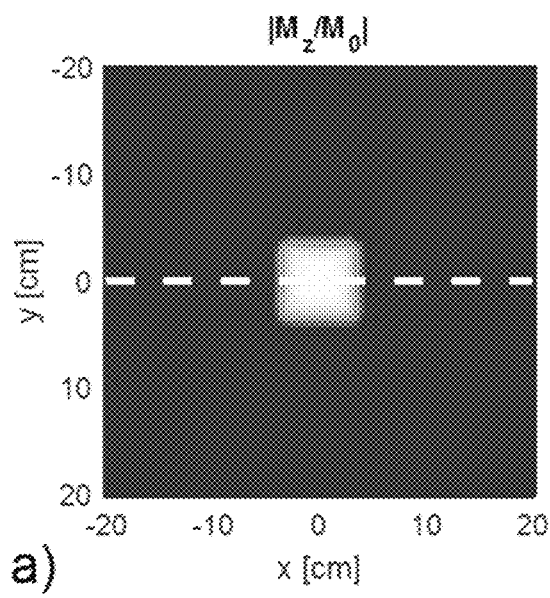
a)
Fig. 2B
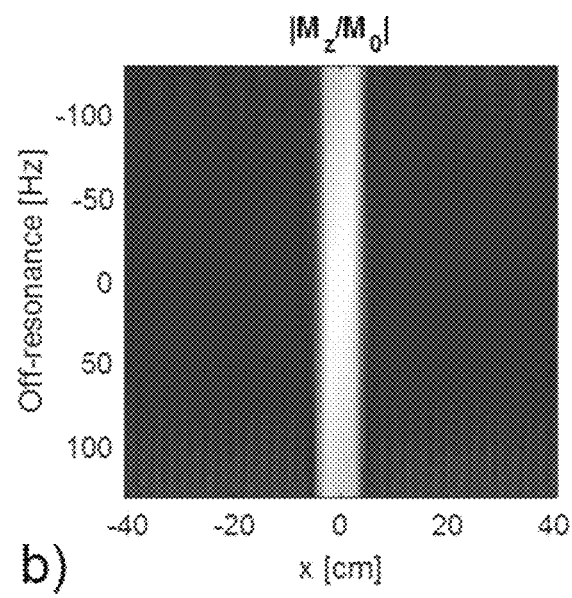
b)
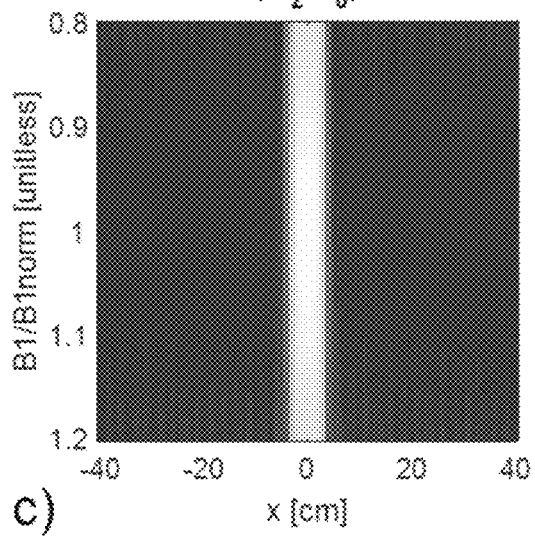
c)
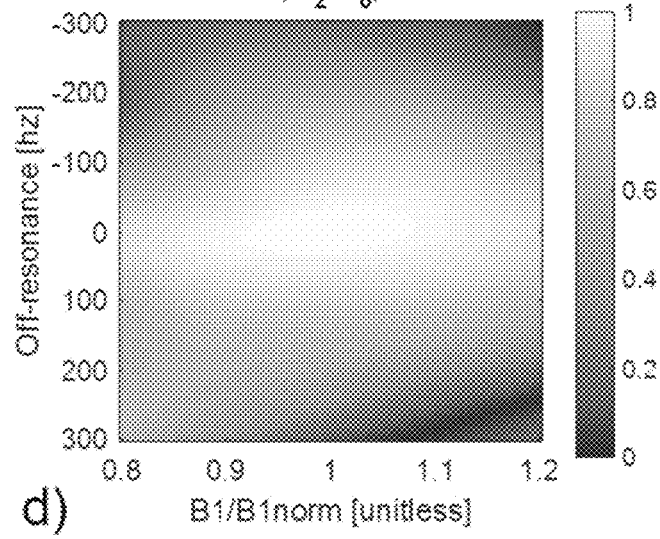
d)
Fig. 2C
Fig. 2D

Fig. 3A
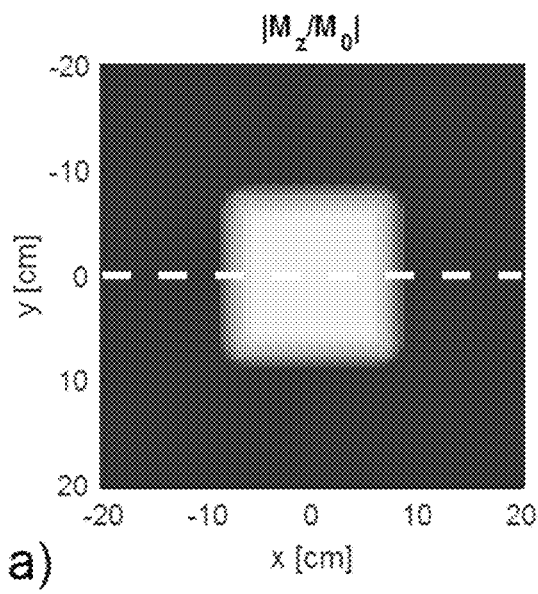
a)
Fig. 3B
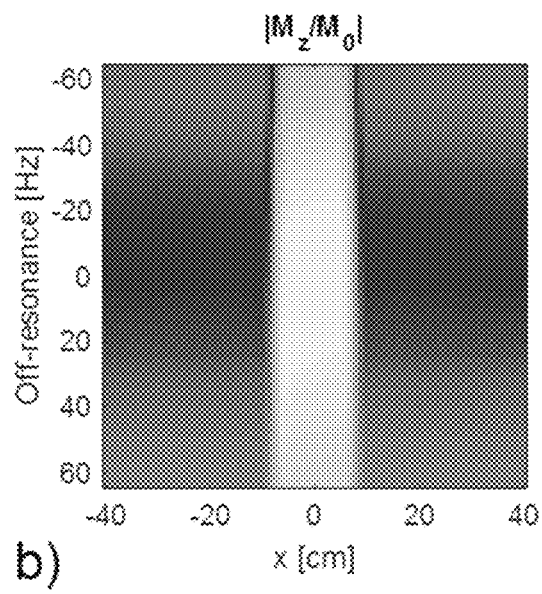
b)
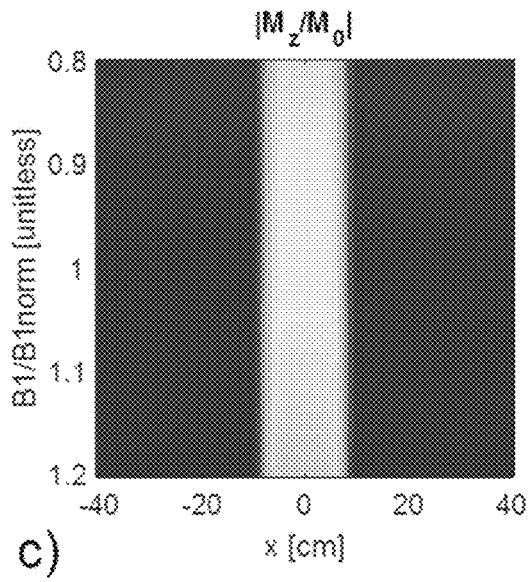
c)
Fig. 3C
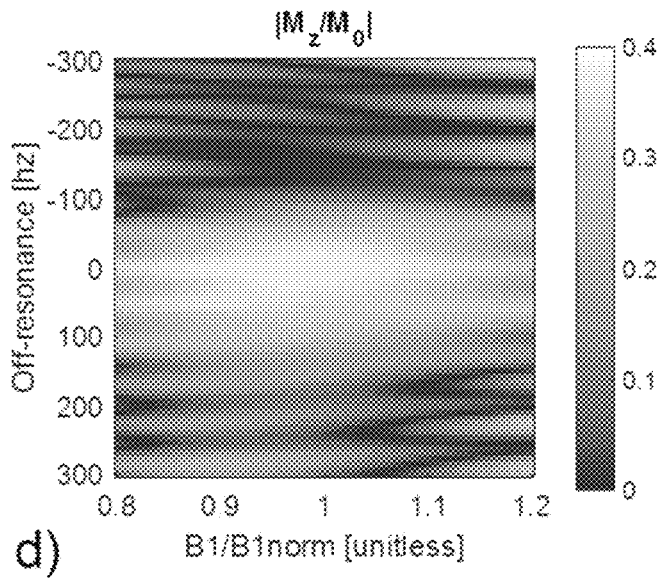
d)
Fig. 3D

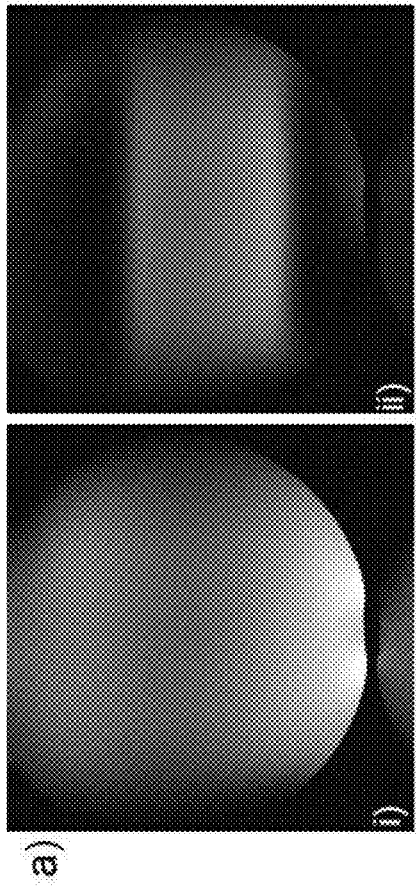
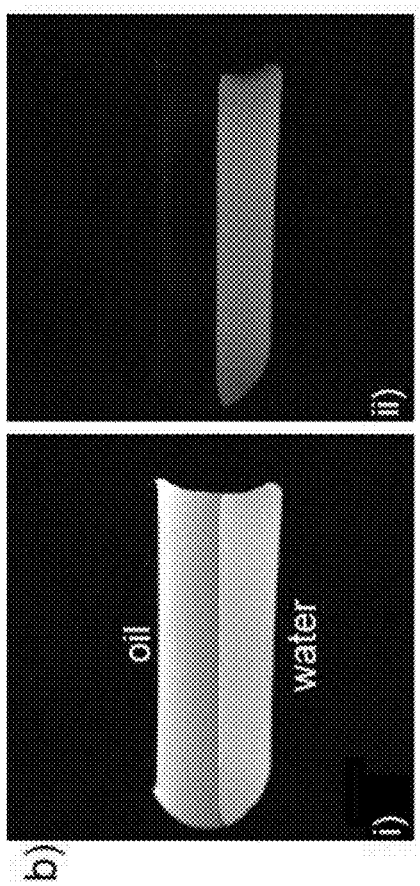
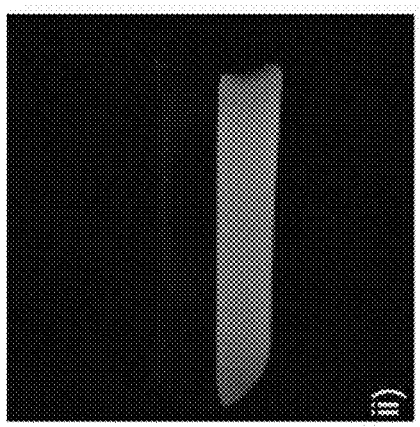
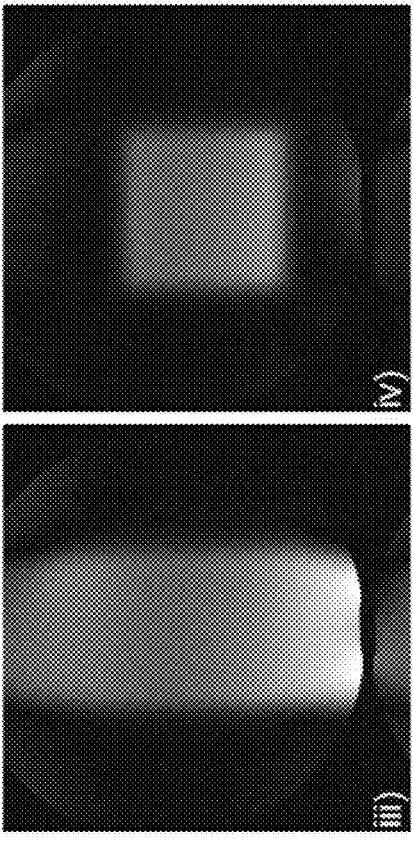
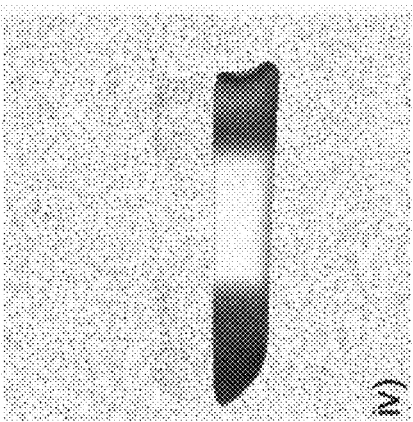
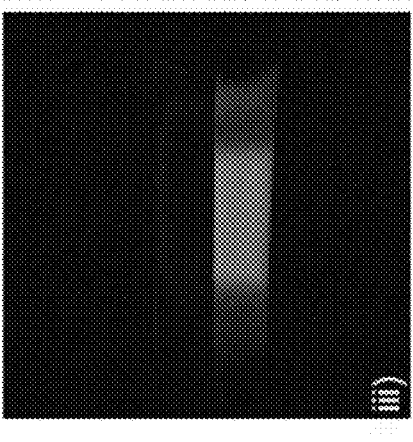
Fig. 4A  Fig. 4B  Fig. 4E  Fig. 4F
Fig. 4C  Fig. 4D  Fig. 4G  Fig. 4H

Fig. 6A Fig. 6B Fig. 6C
  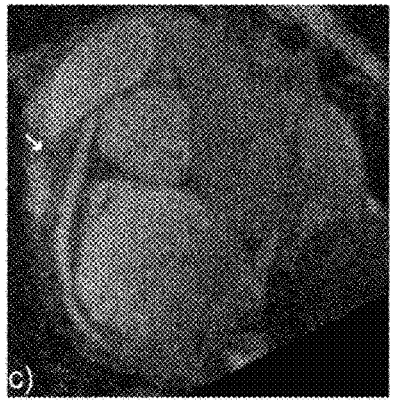
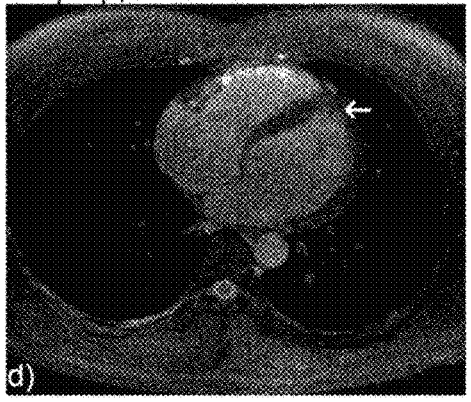  
Fig. 6D Fig. 6E Fig. 6F
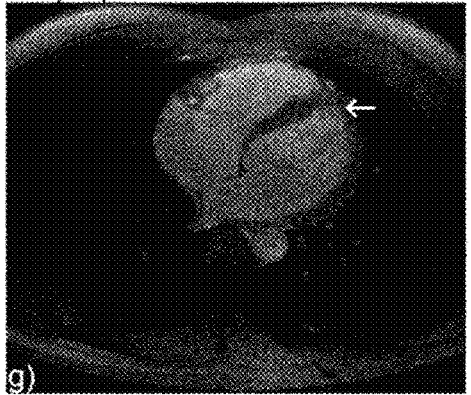  
Fig. 6G Fig. 6H Fig. 6I

MRI RF PULSE SEQUENCE FOR MULTIDIMENSIONAL OUTER VOLUME SUPPRESSION

STATEMENT REGARDING FEDERALLY SPONSORED RESEARCH OR DEVELOPMENT

This invention was made with Government support under contract HL127039 awarded by the National Institutes of Health. The Government has certain rights in the invention.

FIELD OF THE INVENTION

The present invention relates generally to magnetic resonance imaging. More specifically, it relates to techniques for outer volume suppression using improved RF pulse design.

BACKGROUND OF THE INVENTION

In magnetic resonance imaging (MRI), outer volume suppression (OVS) is a technique designed to reduce signal outside a region of interest (ROI) to facilitate faster acquisitions and improve image quality within the ROI. By creating an effectively smaller region to image, the field of view (FOV) can be reduced or restricted to reduce scan time or facilitate higher resolution imaging. Additionally, OVS can improve image quality by suppressing moving anatomy and thus the motion artifacts that may otherwise arise. Suppressing signal outside the ROI also improves the dynamic range inside the ROI.

Previous techniques for OVS have been applied to spectroscopy, diffusion, functional MRI (fMRI), and cardiac imaging. The methods largely fall into two paradigms. One paradigm utilizes sequences that interleave and arrange multiple 1D slab saturation pulses. In spectroscopy, there are several techniques that arrange the saturated slabs in a polygon to primarily suppress subcutaneous fat near the skull. BISTRO is an adiabatic pulse for general applications that similarly arranges saturation slabs in a polygon to achieve 2D OVS. In spinal diffusion, cardiac, and black-blood angiography, there are OVS techniques that saturate slabs on two sides of the ROI to reduce FOV in the phase-encode direction. Also, a projection reconstruction (PR) technique that also saturates slabs on two sides but rotates the saturation direction with the PR acquisition direction to effectively create a 2D OVS.

The other paradigm for OVS is to utilize one spatially selective pulse and one spatially non-selective pulse for a tip-down and tip-up combination. For non-selective tip-downs, BIR-4 pulses are used for their adiabaticity and broad bandwidth. For non-selective tip-ups, adiabatic half passage or sinc pulses are used. Recent techniques of this paradigm utilize a 2D spiral pulse for spatial selectivity as either a tip-down or tip-up pulse. Sequences for general applications play the tip-down pulse and tip-up pulse with minimal time in between. For cardiac imaging, $T_2$-preparation is beneficial and these sequences incorporate double adiabatic full passage (AFP) refocusing.

Current OVS techniques may have long durations, high specific absorption rate (SAR), or an ROI with inflexible selectivity. Thus, there is a need for improvements in OVS techniques.

BRIEF SUMMARY OF THE INVENTION

Two problems that MRI research is constantly trying to address are to improve image quality and reduce scan time. The present invention addresses both by reducing scan time while still maintaining clinically acceptable images.

In one aspect, the present invention provides a technique for a magnetic resonance imaging (MRI) that implements outer volume suppression (OVS) and T2-preparation using a new preparatory pulse sequence. OVS reduces the scan time and can improve image quality. T2-preparation can enhance contrast between tissues of interest. OVS with T2-preparation for coronary magnetic resonance angiography has been shown to improve image quality and reduce scan time. The pulse sequence can also implement fat saturation to reduce the unwanted fat signal, improving image quality. Additionally, this sequence provides a uniform OVS passband robust to inhomogeneities, significantly lower SAR than existing methods, and flexibility to be used as an OVS sequence without T2-preparation.

The pulse sequence involves alternating pairs of excitations, and is referred to herein as APEX. It can achieve an ROI with demonstrated selectivity in two or more spatial dimensions and spectrally. APEX is modular and each module consists of a tip-down pulse, a refocusing pulse, and a customizable tip-up that determines selectivity in one or more dimensions. Each module may have a different tip-up pulse and the modules are played in pairs, with the second module a partially negated version of the first. Timing of the sequence may be adjusted to incorporate $T_2$ weighting. The sequence may be implemented for general OVS with minimal $T_2$-preparation and for imaging with $T_2$-preparation, such as in coronary angiography. The sequence provides a customizable, sharp, and uniform passband with relatively low SAR and short duration.

The APEX (alternating pairs of excitations) sequence used in embodiments of the present invention combines and adapts principles from two paradigms of OVS. Signal suppression is primarily achieved through spatially selective tip-up pulses while robustness and higher dimensional selectivity are achieved through repetition of spatial suppression. When evaluating OVS sequences, important factors to consider include: duration, robustness to $B_0$ (main static field) inhomogeneities, robustness to $B_1$ (radiofrequency field) inhomogeneities, sequence duration, specific absorption rate (SAR), spatial selectivity, and flow sensitivity. The duration of APEX is shorter than recent OVS techniques and has less SAR. Spatially sharp and uniform ROIs with demonstrated selectivity in two dimensions can be achieved. APEX can also achieve spectral selectivity and incurs minimal signal loss from flow. We demonstrate and support these claims of performance with simulations, phantom experiments, and in vivo experiments.

The primary application for outer volume suppression (OVS) with T2-preparation is for blood-related imaging throughout the body, including but not limited to the coronary arteries, renal arteries, and cardiac imaging. T2-preparation enhances contrast between blood and other tissues. OVS suppresses signal from uninteresting areas such that it reduces scan time and improves image quality. In general, the APEX sequence could be applied to any image in which T2-contrast is desired. With a modification of the sequence, the T2-preparation effect can be minimized and this sequence can be treated as a solely OVS sequence which has existing applications including but not limited to spinal imaging, brain imaging, and breast imaging.

This sequence produces images with greater signal-to-noise ratio than existing T2-preparation OVS methods which means image quality is improved. Furthermore, this sequence has lower specific absorption rate than existing T2-preparation OVS methods which means a patient is exposed to less radiofrequency energy. This method is also more robust to variations of the resonant frequency caused by variations in the static magnetic field and to variations of the local magnetic field when transmitting this radiofrequency sequence. Both allow for more consistent and uniform signal in the image. This leads to better results when applying additional algorithms such as motion correction to further improve image quality.

This is the first T2-preparation OVS sequence with a rectangular passband and high robustness to resonant frequency (main static field) inhomogeneities and radiofrequency transmit field inhomogeneities. It is also the first T2-preparation OVS sequence to have a high time-bandwidth product of 8 for sharper transition profiles than existing sequences. The specific absorption rate is 80% lower than existing T2-preparation OVS sequences.

In one aspect, the invention provides a method for magnetic resonance imaging (MRI) using a T2-preparation outer volume suppression (OVS) pulse sequence. An MRI apparatus applies a T2-preparation OVS pulse sequence to reduce the longitudinal magnetization outside a region of interest, excites a region that includes the region of interest, detects the radiofrequency (RF) signals, and generates MRI images from the RF detected signals. The T2-preparation OVS pulse sequence includes, sequentially: a first tip-down excitation pulse, a first refocusing excitation pulse, a first tip-up excitation pulse, a second tip-down excitation pulse that is 180° out of phase with respect to the first tip-down excitation pulse, a second refocusing excitation pulse, and a second tip-up excitation pulse.

Preferably, the second tip-down excitation pulse is a negation in amplitude of the first tip-down excitation pulse. Preferably, an excitation angle of the first tip-down excitation pulse is between 70 degrees and 110 degrees, an excitation angle of the first refocusing excitation pulse is between 160 degrees and 200 degrees, an excitation angle of the first tip-up excitation pulse is between 70 degrees and 110 degrees, an excitation angle of the second tip-down excitation pulse is 70 degrees and 110 degrees, an excitation angle of the second refocusing excitation pulse is between 160 and 200 degrees, and an excitation angle of the second tip-up excitation pulse is between 70 degrees and 110 degrees. In some embodiments, an excitation angle of the first tip-down excitation pulse is determined by maximizing transverse magnetization immediately after the first tip-down excitation pulse and minimizing a longitudinal magnetization outside the ROI during image acquisition, an excitation angle of the first refocusing excitation pulse is determined from a maximum RF amplitude of the MRI apparatus and a desired bandwidth of the first refocusing excitation pulse to refocus and maximize transverse magnetization at an echo time of the first tip-up pulse, an excitation angle of the first tip-up excitation pulse is determined by maximizing a longitudinal magnetization in the ROI immediately after the first tip-up excitation pulse and minimizing a longitudinal magnetization outside the ROI during image acquisition, an excitation angle of the second tip-down excitation pulse is determined by maximizing a transverse magnetization immediately after the second tip-down excitation pulse and minimizing a longitudinal magnetization outside the ROI during image acquisition, an excitation angle of the second refocusing excitation pulse is determined from the maximum RF amplitude of the MRI apparatus and the desired bandwidth of the second refocusing excitation pulse to refocus and maximize transverse magnetization at an echo time of the second tip-up excitation pulse, and an excitation angle of the second tip-up excitation pulse is determined by maximizing a longitudinal magnetization in the ROI immediately after the second tip-up excitation pulse and minimizing a longitudinal magnetization outside the ROI during image acquisition.

In a particular preferred implementation the excitation angle of the first tip-down pulse is 90 degrees, the excitation angle of the first refocusing pulse is 180 degrees, the excitation angle of the first tip-up pulse is 90 degrees, the excitation angle of the second tip-down pulse is 90 degrees, the excitation angle of the second refocusing pulse is 180 degrees, and the excitation angle of the second tip-up pulse is 90 degrees.

Preferably, the first refocusing pulse refocuses orthogonally to the first tip-down for Carr-Purcell-Meiboom-Gill (CPMG) conditions, or the second refocusing pulse refocuses orthogonally to the second tip-down for Carr-Purcell-Meiboom-Gill (CPMG) conditions In one embodiment, the first and second tip-up excitation pulses are selective spatially and/or spectrally. In an alternate embodiment, the first and second tip-down excitation pulses are selective spatially and/or spectrally.

In embodiments where the first and second tip-up excitation pulses are selective spatially and/or spectrally, preferably, the first tip-down excitation pulse is a 90 degree composite pulse, the second tip-down excitation pulse is a 90 degree composite pulse, the first refocusing pulse is a 180 degree hard pulse, the second refocusing pulse is a 180 degree hard pulse, the first tip-up pulse is a sinc, the second tip-up pulse is a sinc, the first tip-up pulse is a 90 degree spectral-spatial pulse with sinc envelope and sinc subpulses, and/or the second tip-up pulse is a 90 degree spectral-spatial pulse with sinc envelope and sinc subpulses.

In alternate embodiments where the first and second tip-down excitation pulses are selective spatially and/or spectrally, preferably, the first tip-up excitation pulse is a 90 degree composite pulse, the second tip-up excitation pulse is a 90 degree composite pulse, the first refocusing pulse is a 180 degree hard pulse, the second refocusing pulse is a 180 degree hard pulse, the first tip-down pulse is a sine, the second tip-down pulse is a sinc., the first tip-down pulse is a 90 degree spectral-spatial pulse with sine envelope and sine subpulses, and/or the second tip-down pulse is a 90 degree spectral-spatial pulse with sinc envelope and sinc subpulses.

In another aspect, the invention provides a non-transitory, tangible, computer-readable storage medium containing a program of instructions that cause an MRI scanner to implement the methods described above.

BRIEF DESCRIPTION OF THE SEVERAL VIEWS OF THE DRAWINGS

FIGS. 2A-D are graphs of Bloch simulations of 2D OVS with spatial sinc tip-ups, $T_{prep}$=6 ms, and no relaxation, demonstrate the robustness of the sequence, according to an embodiment of the invention.

FIGS. 3A-D are graphs of Bloch simulations of 2D OVS sequence with spectral-spatial sinc tip-up, $T_{prep}$=35 ms, $T_1/T_2$ representing muscle to represent the robustness of the sequence in cardiac imaging, according to an embodiment of the invention.

FIGS. 4A-H are SNR phantom and water/oil phantom image results with spectral-spatial sinc tip-up, according to an embodiment of the invention.

FIGS. 6A-I are In vivo coronary scans, according to an embodiment of the invention.

DETAILED DESCRIPTION OF THE INVENTION

Figures 1A, 1B:
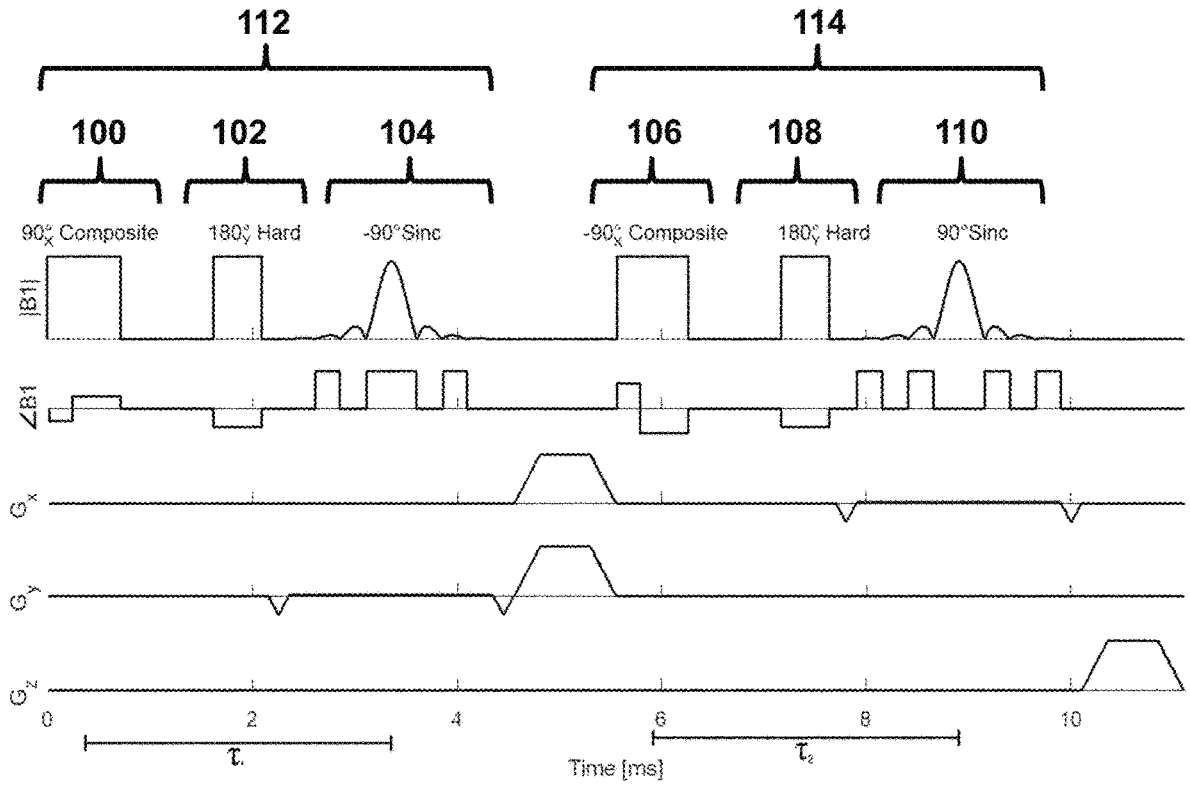
FIG. 1A is a timing diagram of an example OVS pulse sequence with sinc tip-up, according to an embodiment of the invention.
FIG. 1B is a flow chart outlining the steps of an MRI technique using a pulse sequence according to an embodiment of the invention.

FIG. 1A is a timing diagram of an example APEX pulse sequence with sinc tip-up, according to an embodiment of the invention. The sequence has a first half 112 and a second half 114.

The first half of the sequence plays a 90° composite tip-down pulse 100, a 180° orthogonal hard refocusing pulse 102, and a selective −90° spatial sinc tip-up pulse 104 with appropriate timings for an echo time of $\tau_1$. The remaining transverse magnetization is spoiled. The second half negates in amplitude the tip-down and tip-up pulses, with echo time $\tau_2$. Specifically, the second half of the sequence begins with a tip-down pulse 106 that is an amplitude-negated version of the first tip-down pulse 100 to tip in the opposite direction. The refocusing pulse 108 is the same as 102 and the selective tip-up pulse 110 is independent of the first selective tip-up pulse 104. The remaining transverse magnetization is again spoiled. The combined effects of the two selective tip-up pulses 104 and 110 determine the nature of the OVS. The anti-symmetry of the overall sequence is important for $B_1$ robustness for the passband. By tipping down in opposite directions for each half of the sequence, any imperfections from the first half of the sequence are compensated by the second half.

There is a total $T_2$ decay time of $T_{prep}=\tau_1+\tau_2$. The value of $T_{prep}$ can be adjusted to incorporate $T_2$-weighting for applications such as angiography. For general applications, $T_{prep}$ can be minimized.

The tip-down pulses 100 and 106 are 90°, $90_{-60}180_{60}$ composite pulses that are rotated such that the on-resonance magnetization is tipped onto the Y axis. By design, composite pulses are robust to $B_1$ inhomogeneities. Additionally, the bandwidth is sufficient to be robust to off-resonance and excite fat at 1.5 T. In the passband of the pulse, the phase is approximately linear. This permits the pulse to be paired with a conventional tip-up pulse that has linear phase.

The refocusing pulses 102 and 108 are 180° hard pulses. Off-resonance robustness of the sequence is constrained by the refocusing pulse so increasing bandwidth will improve performance. $B_1$ robustness is added by refocusing orthogonally to satisfy CPMG conditions with this pulse.

APEX can be adapted to various applications by customizing the two tip-up pulses 104 and 110 at the end of each half of the sequence. The sequence in FIG. 1A is configured for 2D spatial selectivity for general imaging with OVS and $T_{prep}$ is minimized. The tip-up pulses 104 and 110 are 90° sinc with time-bandwidth product (TBW) 8.

A method of MRI using the pulse sequence of FIG. 1A is outlined in the flowchart of FIG. 1B. The steps are all performed by a conventional MRI apparatus, using standard methods of operation, appropriately configured to use the pulse sequence in accordance with the teachings of the present invention. In step 150 it applies a T2-preparation OVS pulse sequence to reduce the longitudinal magnetization outside a region of interest. In step 152 it excites a region that includes the region of interest, in step 154 detects the radiofrequency (RF) signals, and in step 156 generates MRI images from the RF detected signals.

For applications such as coronary angiography, $T_2$-preparation is beneficial for contrast enhancement. This requires a longer $T_{prep}$ and allows more time for sophisticated pulses. We use a 90° spectral-spatial sinc composed of spatial sinc subpulses with TBW 8 under a spectral sinc envelope with TBW 8. The pulse is spectrally designed with the assumption of cardiac imaging at 1.5 T. The passband for water is prioritized and as a tradeoff, the range of fat off-resonant frequencies is placed partially in the stopband and partially in the transition band.

The spoiling gradients are on orthogonal axes to prevent stimulated echoes. Spoiling while the desired magnetization is longitudinal rather than transverse is crucial for minimizing flow-related phase effects. If suppressing flow signal is desirable, such as in black-blood imaging, spoilers can also be placed before and after each refocusing pulse.

Numerical Bloch simulations were performed to evaluate the resulting $M_Z$ after the sequence. Bloch simulations with a spatial sinc tip-up were performed with $T_{prep}=6$ ms and ignoring relaxation ($T_1=\infty$, $T_2=\infty$). Off-resonance was simulated over a frequency range of [−128,128] Hz. $B_1$ inhomogeneities were simulated over a range of [0.8,1.2] of the normalized $B_1$ value. Bloch simulations with a spectral-spatial sinc tip-up intended for coronary angiography were performed with $T_{prep}=35$ ms and with time constants simulating muscle at 1.5 T ($T_1=1008$ ms, $T_2=44$ ms). Off-resonance was simulated over frequency ranges of [−64,64] Hz and [−300,300] Hz to consider off-resonance of water and lipids at 1.5 T. $B_1$ inhomogeneities were simulated over a range of [0.8,1.2] of the normalized $B_1$ value.

FIGS. 2A-D shows the results of Bloch simulations of 2D OVS with spatial sinc tip-ups, $T_{prep}=6$ ms, and no relaxation, demonstrate the robustness of the sequence. The graph a) shows spatial profile with 2D OVS region. The graph b) shows spatial off-resonance sensitivity along the dashed line in a) for ±1 ppm at 1.5 T. Worst-case stopband is 0.95% $M_0$. The graph c) shows spatial $B_1$ sensitivity along the dashed line in a). Worst-case stopband is 2.67% $M_0$. The graph d) shows magnetization at isocenter as a function of $B_0$ and $B_1$ inhomogeneities. The results demonstrate that the sequence can achieve a high TBW spatial profile with good robustness to off-resonance and $B_1$ inhomogeneities. Within ±1 ppm for 1.5 T, off-resonance has worst-case performance of 0.95% $M_0$ remaining stopband signal. Within ±20% desired $B_1$, a worst-case 2.66% $M_0$ stopband signal remains. Inspecting FIG. 2D, there is a large operating envelope at both 1.5 T to accommodate inhomogeneities.

The most important factor for generating off-resonance robustness in this sequence is the alternating tip-down angles. If the two tip-down angles are the same polarity, the passband remains largely the same but the stopband is not tolerant of $B_0$ inhomogeneity. For the sequence simulated in FIGS. 2A-D, worst-case stopband signal at ±1 ppm at 1.5 T is 0.95% $M_0$. If both tip-down angles were to be in the same direction, the sequence would maintain this same performance over a range of less than ±0.05 ppm.

FIGS. 3A-D show the results of Bloch simulations of 2D OVS sequence with spectral-spatial sinc tip-up, $T_{prep}=35$ ms, $T_1/T_2$ representing muscle to represent the robustness of the sequence in cardiac imaging. The graph a) shows spatial profile with 2D OVS region. The graph b) shows spatial off-resonance sensitivity along the dashed line in a) for ±1 ppm at 1.5 T. Worst-case stopband is 11.3% $M_0$. The graph c) shows spatial $B_1$ sensitivity along the dashed line in a).

Worst-case stopband is 2.22% $M_0$. The graph d) shows magnetization at isocenter as a function of $B_0$ and $B_1$ inhomogeneities. Note the suppression of fat at −220 Hz. We again see that we can achieve high TBW spatial profiles. Within ±1 ppm, off-resonance has worst-case performance of 11.3% $M_0$ remaining stopband signal. Within ±20% desired $B_1$, the stopband signal has worst-case performance of 2.22% $M_0$. From FIG. 3D, we see that there is a large operating envelope for the passband as well as a large region of suppression for fat at around −220 Hz.

Phantom experiments were performed with a spectral-spatial sinc as the tip-up pulse to evaluate the spatial selectivity and fat saturation of the OVS sequence. The MRI imaging experiments were conducted on a 1.5 T GE Signa Excite scanner (GE Healthcare, Waukesha, Wis.) with a maximum gradient amplitude of 40 mT/m and slew rate of 150 mT/m/ms. All scans used the body coil for transmission. The phantom and in vivo cardiac studies used an 8-channel cardiac receive coil. The composite and refocusing pulse had durations of 900 μs and 600 μs respectively. The images were acquired with a single-slice gradient-echo sequence with field of view (FOV) 28 cm×28 cm, 5 mm slice thickness, 256×256 matrix size, TE=2 ms, TR=200 ms, flipangle=30°, and $T_{prep}$=35 ms.

A spherical phantom with radius 14 cm was used to evaluate spatial selectivity. The spatially selective gradients were scaled to achieve a 14 cm passband. To demonstrate and evaluate the versatility and properties of the tip-up pulses, the spatial selectivities of each tip-up pulse were turned on and off.

To evaluate the spatial suppression of the sequence, a quotient image was calculated by dividing the image with OVS by an image without OVS, $Q = I_{OVS}/I_{noOVS}$. Using the quotient image, passband-to-stopband ratio (PSR) was calculated by dividing mean signal of ROIs in the passband and stopband such that $PSR = Q_{passband}/Q_{stopband}.$ A water/oil phantom was used to evaluate fat saturation.

Acquisitions of the phantom with no OVS sequence, the proposed sequence with $T_2$-preparation and no OVS, and the proposed sequence with $T_2$-preparation and OVS were performed. To evaluate the fat saturation, we compared the mean signal remaining after OVS with the signal acquired without preparation. We also evaluated spatial PSR by comparing the image with $T_2$-preparation but no OVS with the image with $T_2$-preparation and OVS.

FIGS. 4A-H show SNR phantom and water/oil phantom results with spectral-spatial sinc tip-up. Images FIGS. 4A-D show SNR phantom with spatially selective gradients turned on and off to show spatial versatility of the preparation sequence. FIG. 4A: No gradients on. FIG. 4B: Y gradient on; passband-to-stopband ratio (PSR)=5.2. FIG. 4C: X gradient on; PSR=6.0. FIG. 4D: Both gradients on; PSR=7.9 on left and right and PSR=5.3 on top and bottom. Images FIGS. 4E-H show FIG. 4E: Water/oil phantom without preparation sequence. FIG. 4F: Water/oil phantom with $T_2$-preparation and fat saturation but no OVS. FIG. 4G: Water/oil phantom with $T_2$-preparation, fat saturation, and OVS. FIG. 4H: Quotient image of FIG. 4G divided by FIG. 4F; PSR=5.7 in water and 8.6% lipid signal remains relative to FIG. 4E.

FIG. 4B is spatially selective in Y and has PSR=5.2. FIG. 4C is spatially selective in X and has PSR=6.0. When both spatially selective gradients are on in FIG. 4D, PSR=7.9 horizontally and PSR=5.3 vertically. Water/oil phantom results in FIGS. 4E-H demonstrate a 91.4% suppression of lipids and in the water region of the phantom, PSR=5.7.

In vivo head scans were used to demonstrate the performance of the sequence when no contrast manipulation is desired. The in vivo head scans used an 8-channel head coil. To minimize $T_{prep}$, a 2 ms spatial sinc tip-up was used. Images were acquired with FOV=28 cm×28 cm, 10 mm slice thickness, 256×128 matrix size and $T_{prep}$=6 ms. Total OVS duration was 11.1 ms and the sequence was played every TR. Proton-density-weighted images were acquired with spoiled gradient echo TE=2 ms, TR=1000 ms, flip angle=30°. $T_1$-weighted images were acquired with spoiled gradient echo TE=2 ms, TR=30 ms, flip angle=20°. T2-weighted images were acquired with spin echo TE=50 ms, TR=1000 ms, flip angle=30°. For a typical tissue with $T_2$=50 ms, 89% of the original signal is expected to remain in the passband after OVS. The goal of these scans was to qualitatively demonstrate that the slight $T_2$ weighting of the OVS sequence does not drastically alter the magnetization within the OVS FOV.

Figure 5C:
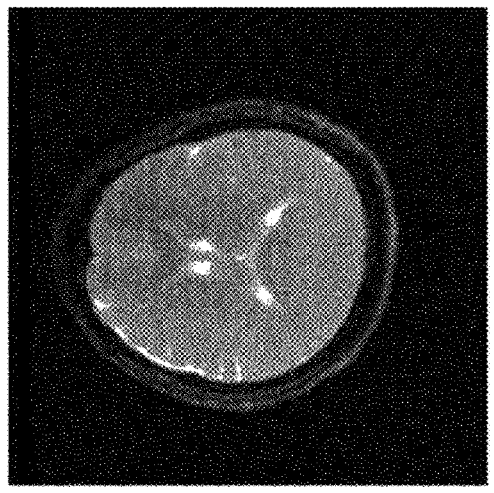
FIGS. 5A-F are images of In vivo head scans, according to an embodiment of the invention.
Figure 5B:
Figure 5A:
Figure 5F:
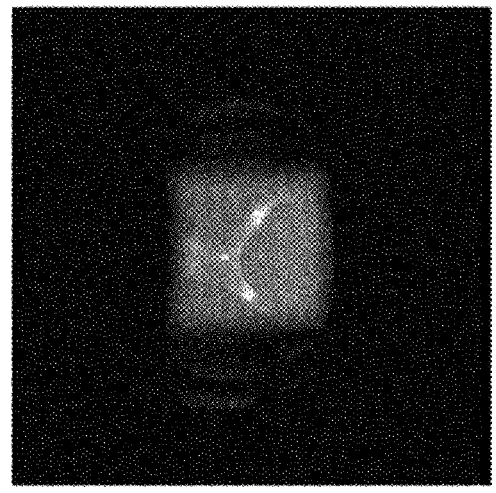
Figure 5E:
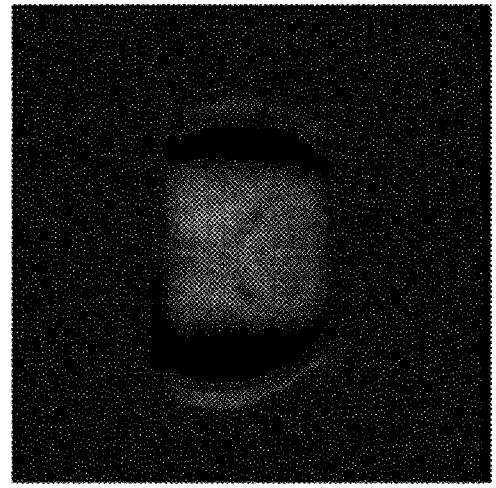
Figure 5D:
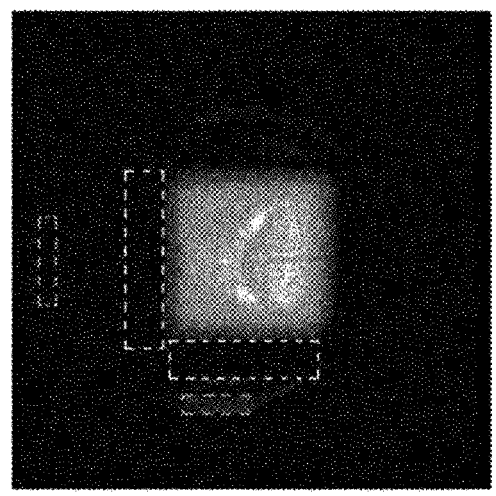

FIGS. 5A-F show in vivo head scan results. The top row shows reference images and the bottom row shows images acquired with identical parameters but with OVS. PSR results are shown in Table I. Partial volume effects are visible in the ventricles in FIGS. 5A-B. Examining each pair of images, we see that the desired contrast is maintained even with OVS. These results demonstrate that this sequence does not significantly affect the passband magnetizations and can be used as a standalone OVS technique. Images FIGS. 5A, 5D show proton-density-weighted scan. ROIs for calculation of horizontal and vertical PSRs for brain tissue (white) and fat (orange) are shown. Images FIGS. 5B, 5E show $T_1$-weighted scan. Images FIGS. 5C, 5F show $T_2$-weighted scan.

TABLE I

PSR RESULTS FOR HEAD SCANS IN FIG. 5

| Contrast | Brain Tissue PSR | | Fat PSR | |
| --- | --- | --- | --- | --- |
| | Vertical | Horizontal | Vertical | Horizontal |
| PD | 23.1 | 17.8 | 4.5 | 2.5 |
| $T_1$ | 21.9 | 16.2 | 4.1 | 2.2 |
| $T_2$ | 18.1 | 14.5 | 2.1 | 1.5 |

In vivo cardiac scans were performed to demonstrate the versatility of the sequence and its application to coronary angiography. The spectral-spatial sinc tip-up designed for coronary angiography with pulse duration 7 ms was used. Acquisitions were gated by plethysmography for acquisition during diastole. Images were acquired with a 3D cones trajectory with alternating-TR (aTR) steady-state free precession (SSFP), TE=0.5 ms, $TR_1/TR_2$=4.484/1.196 ms, FOV=28 cm×28 cm×14 cm, flip angle=70°, 1.2 mm isotropic resolution, 2D OVS ROI=14.5 cm×11.4 cm, and $T_{prep}$=35 ms. The cones were acquired in a phyllotaxis order to improve image quality and robustness to motion. The SSFP was catalyzed by a cosine ramp of 10 pulses for a catalyzation time of 56 ms. The OVS sequence was played once every R-R interval immediately before the SSFP catalyzation. The aTR timings were chosen to place an SSFP spectral null on fat for further fat suppression. 3D image-based navigators (iNAVs) were collected after the cones acquisition to construct a 3D translational motion model and the k-space acquisitions were adjusted with linear phase compensation for retrospective motion correction. $T_2$-preparation is common in coronary MR angiography for increasing blood-myocardium contrast. Thus, to demonstrate the additional effects of OVS, we performed three scans: with no OVS or $T_2$-preparation, with $T_2$-preparation only, and with both OVS and $T_2$-preparation. To evaluate the images, we calculated blood signal-to-noise ratio (SNR) and blood-myocardium contrast-to-noise ratio (CNR). SNR is calculated from an ROI in the left ventricle (LV) such that SNR=$\mu_{LV}/\sigma_{LV}$. CNR compares the signal from an ROI in the left ventricle with the signal from an ROI in the myocardium (MYO) of the interventricular septum such that CNR=$(\mu_{LV}-\mu_{MYO})/\sigma_{LV}$.

FIGS. 6A-I shows reformatted in vivo maximum intensity projection cardiac scan results with 2.5 mm slabs. The images are MIPs with slab width 2.5 mm, acquired without preparation sequence (top row), with $T_2$-preparation but no OVS (middle row), and with both $T_2$-preparation and 2D OVS (bottom row). FIGS. 6A, 6D, 6G are axial slices. FIGS. 6B, 6E, 6H are reformatted views showing the left anterior descending coronary artery. FIGS. 6C, 6F, 6I are reformatted views showing the right coronary artery. Note the significant suppression of chest muscle from the 2D OVS and the increased blood-myocardium contrast (white arrows) and sharpness (green arrows) from the $T_2$-preparation. FIG. 6D-I show enhanced blood-myocardium contrast from $T_2$-preparation.

FIG. 6G clearly demonstrates suppression in the stopband chest muscle from OVS. Dividing the image of FIG. 6G by FIG. 6D, the muscle PSR=3.2. FIG. 6A (without preparation) has blood SNR=7.47 and blood-myocardium CNR=1.65. FIG. 6D ($T_2$-preparation, no OVS) has blood SNR=6.77 and blood-myocardium CNR=3.21. FIG. 6G ($T_2$-preparation, OVS) has blood SNR=7.42 and blood-myocardium CNR=3.46. The increases in contrast and sharpness can be seen by the arrows.

From the phantom and in vivo results, we see that APEX can achieve sharp spatial profiles with strong suppression, corroborating Bloch simulation results. This sequence has sufficient bandwidth for robustness to typical off-resonance at 1.5 T. To further improve off-resonance performance, higher maximum RF amplitude is used to achieve higher bandwidths for both the composite 90° tip-down and 180° refocusing pulses.

Almost all existing OVS techniques are robust to $B_1$ inhomogeneities either from adiabatic pulses or repeated saturation. The simulations of APEX with both sinc and spectral-spatial sinc tip-ups demonstrate the robustness of this sequence to $B_1$ inhomogeneity as well. However, sequences using adiabatic pulses likely have greater $B_1$ inhomogeneity robustness, especially when $B_1$ exceeds its nominal value. Additionally, sequences using adiabatic refocusing pulses can achieve greater bandwidth than hard pulses and have greater off-resonance robustness as a result.

The two tip-up pulses presented are both based on sincs and the flip angles are thus linearly sensitive to small $B_1$ inhomogeneities. In general, many potential tip-up pulses are linearly sensitive to $B_1$ inhomogeneities. However, the tip-up pulses are nominally 90°. For some small tip angle inhomogeneity $\varepsilon$, $M_z$ is proportional to $\sin(90°+\varepsilon)$, which has a first-order derivative of zero, mitigating net sensitivity to $B_1$ inhomogeneity. Furthermore, although transverse magnetization is proportional to $\cos(90°+\varepsilon)$, which is sensitive to inhomogeneities, we are spoiling immediately. This creates an effective reset of the magnetizations in the passband such that any imperfections are not magnified.

Additional robustness for the selectivity of the sequence can be gained by repeating the tip-up pulse in both halves. The configuration for cardiac imaging already implements this by spectrally suppressing fat twice.

As a tradeoff for using adiabatic pulses or repeated RF pulses to achieve $B_0$ and $B_1$ robustness, existing sequences have high SAR.

Additionally, many existing sequences are time consuming, especially those that achieve OVS by saturating multiple 1D slabs, with some durations over 200 ms. Sequences with spatially selective tip-up and tip-down pulses are in general shorter. The sequence in the configuration shown in FIG. 1A is 11.1 ms.

Phantom results corroborate the performance of the sequence in the Bloch simulations. We see a lower PSR in FIG. 4B because we are spatially selecting Y with the first half of the pulse and the magnetization recovers by $T_1$ relaxation in these regions as the remainder of the pulse is played. This effect is also seen in the lower PSR for the regions above and below the ROI in FIG. 4D and FIGS. 5A-F. In general, $T_1$ recovery can be minimized by minimizing $T_{prep}$. However, when $T_2$-preparation is desired, $T_{prep}$ is constrained. This recovery should also be kept in mind when deciding which spatial location to suppress first. For example, in cardiac and abdominal imaging, a judgment must be made on whether it is more important to suppress signal from the chest wall or arms. Several factors must be considered, such as fat suppression, coil sensitivities, and PSF aliasing patterns. $T_1$ recovery considerations are not as crucial when using alternative $T_2$-preparation OVS techniques with a single tip-up.

The head scan results demonstrate expected contrast when $T_{prep}$ is minimized. This suggests that APEX can be used in MiI applications even where $T_2$-weighting may not be desired. To further minimize $T_2$-weighting, additional techniques can be used to reduce the tip-up pulse duration such as time-optimal VERSE.

The head scans with proton-density-weighted, $T_1$-weighted, and $T_2$-weighted contrasts have vertical PSRs of 23.1, 21.9, and 18.1 and horizontal PSRs of 17.8, 16.2, and 14.5 respectively. This is similar to results from reference which had PSR=16.6 from its phantom results. The fat has relatively lower PSR, likely due to its shorter $T_1$.

From the coronary angiography results, we see that when comparing the images with no $T_2$-preparation or OVS to the image with only $T_2$-preparation, the SNR has decreased and the CNR has increased. This is expected because it has been demonstrated in previous work that $T_2$-preparation increases CNR and by the nature of $T_2$-preparation, the signal decreases. When comparing the images with $T_2$-preparation and no OVS to the images with $T_2$-preparation and OVS, we see that the chest muscle has already become partially suppressed from the $T_2$-preparation and the OVS further reduces the signal. The myocardium PSR=3.2 echo the results from reference, which had a mean PSR=3.18. Suppression of the arms from $T_2$-preparation and OVS to reduce aliased signal when reconstructing likely accounts for the sharper coronary images.

We see in FIGS. 6A-I that fat signal in the coronary angiography images is not suppressed as well as in the water/oil phantom results from FIGS. 4A-H. The fat signal recovery can be likely attributed to $T_1$ recovery. We catalyze the aTR SSFP for 56 ms before we start acquisition. Assuming a $T_1$ of 252 ms and 8.6% fat signal immediately after the OVS sequence, the fat has recovered 27% of its signal at the beginning of acquisition. Furthermore, whereas we use aTR SSFP and choose $TR_1/TR_2$ to place a spectral null on fat, the null is spectrally narrow and thus sensitive to off-resonance. Additionally, the majority of fat, especially in the chest, is subcutaneous and thus lies in the areas of strongest coil sensitivity, amplifying its received signal.

In these fully sampled images, the recovered chest fat signal does not impact image quality but aliasing could become an issue when attempting to reduce the FOV. The severity of the aliasing artifact can be reduced by selecting a trajectory that oversamples the center of k-space, such as cones, 3D radial, and PROPELLER trajectories. Oversampling will reduce low frequency aliasing and as we can see from FIGS. 6A-I, chest fat has few high frequency structures. Additionally, the aliasing artifact may be a worthwhile tradeoff for improved resolution or scan time but investigating this claim is beyond the scope of this study.

In contrast to the cardiac results, the brain images with OVS in FIGS. 5A-F have less fat signal. The difference is that in the brain images, the OVS sequence is played every TR whereas in the cardiac images, the OVS sequence is played once every R-R interval. Thus, by repeating the OVS sequence every TR, suppression is more effective at a cost of a longer minimum TR. However, the short duration of APEX minimizes this impact and makes repeating this sequence every TR potentially viable. Alternatively, this OVS sequence does not necessarily need to be played every TR and could be inserted as needed with respect to tissue $T_1$ to minimize impact on scan duration and SAR.

Another advantage of this sequence is its uniform, high TBW passband. Alternative OVS sequences use 2D-spiral pulses which result in sensitivity to $B_0$ and $B_1$ inhomogeneities that distort the 2D passband profile in the form of ripple and phase shifts. 2D-spiral pulses also cannot achieve a high TBW in the allotted excitation time. These apodization effects can negatively impact intensity-based motion correction algorithms. A more uniform passband also leads to lower passband variance and thus higher SNR.

All the experiments were performed at 1.5 T and translation of sequence performance to 3 T remains to be investigated. The Bloch simulation results of FIGS. 2A-D hint at possible 3 T performance. From FIG. 2b, off-resonance has worst-case performance of 6.14% $M_0$ remaining stopband signal over the range ±1 ppm at 3 T. The results from FIG. 2C show worst-case 2.22% $M_0$ over ±20% $B_1$ inhomogeneity. However, $B_0$ and $B_1$ inhomogeneities are greater at 3 T than 1.5 T and results from a greater range would need to be investigated.

Finally, each tip-up pulse provides up to 2D selectivity. We have taken advantage of this through the spatial-spectral pulses for cardiac imaging. There is also a possibility for selectivity spectrally and in three spatial dimensions for 4D OVS. Initial Bloch simulation results demonstrate that this is achievable.

The first tip-up pulse and second tip-up pulse can be frequency modulated such that the OVS passband is shifted spatially.

Figure 7:
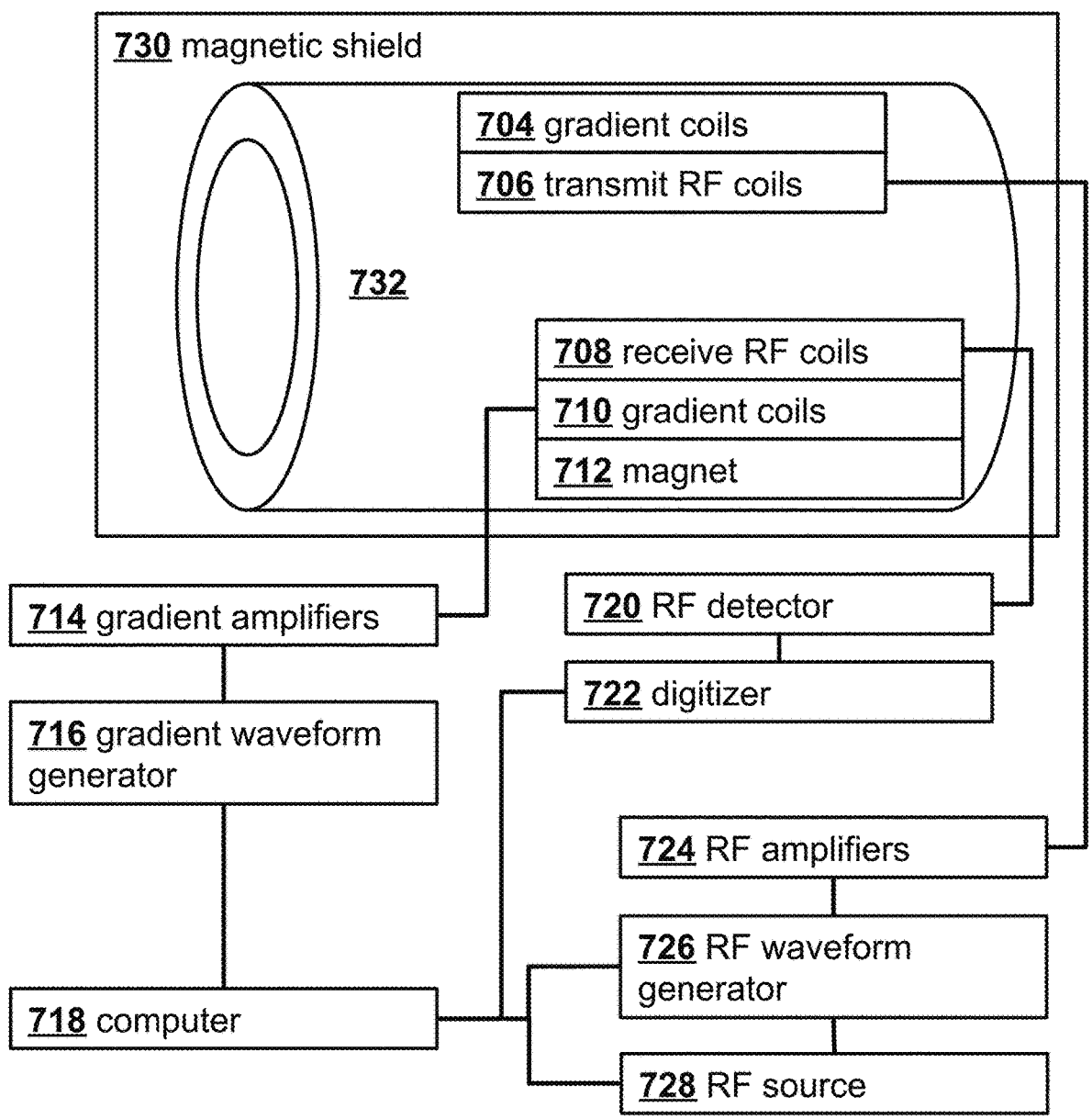
FIG. 7 is an MRI apparatus that can be used to implement an MRI scan according to an embodiment of the invention.

FIG. 7 illustrates an example of an MRI apparatus 700 suitable for MRI scanning using the pulse sequences according to embodiments of the present invention. The apparatus includes an enclosure 732 which has magnets 702, 712, gradient coils 704, 710, transmit RF coils 706 and receive RF coils 708. Computer 718 sends signals to RF waveform generator 726 and RF source 728 to generate a T2-preparation OVS pulse sequence, which is amplified by RF amplifiers 724, to produce exciting RF waveform signals transmitted by transmit coils 706. Computer 718 also controls gradient waveform generator 716 that generates gradient waveforms. The waveforms are amplified by gradient amplifiers 714 that drive gradient coils 710, 704. MRI signals responsive to the excitation signals are detected by receive RF coils 708 and detected by RF detector 720. The detected signals are digitized by digitizer 722 and then provided to computer 718 for further processing and image construction. The computer may include non-transitory, tangible, computer-readable storage media that contains a program of instructions that cause the computer to perform one or more of the operations that are describe herein, including storing and generating the pulse sequence. The magnetic shielding 730 may limits the extent of the magnet's fringes field and to protect the scanner from external magnetic fields.

The apparatus may be configured to perform the techniques of the present invention by means of a non-transitory, tangible, computer-readable storage medium containing a program of instructions that cause an Mill scanner to implement the methods described herein.

We have presented a new framework for implementing multidimensional OVS with robustness to $B_0$ and $B_1$ inhomogeneities. Furthermore, the OVS sequence can be made relatively short and has relatively low SAR. APEX is designed to be simple to implement and have minimal impact on overall scan time. We have demonstrated the sequence in several in vivo examples and the flexibility of the sequence suggests it is suitable for other applications as well.

The invention claimed is:

1. A method for magnetic resonance imaging (MRI) using a T2-preparation outer volume suppression (OVS) and fat suppression pulse sequence, the method comprising:
  with an MRI apparatus, applying a T2-preparation OVS pulse sequence to reduce the longitudinal magnetization outside a region of interest (ROI);
  and with the MRI apparatus, exciting a region that includes the region of interest, detecting from the region radiofrequency (RF) signals responsive to the excitation, and generating MRI images from the detected RF signals;
  wherein the T2-preparation OVS pulse sequence comprises, sequentially:
  a first half of the sequence comprising:
    a first tip-down 90°, $90_{60}180_{60}$ composite excitation pulse,
    a first 180° orthogonal hard refocusing excitation pulse,
    a first tip-up spatially and spectrally selective −90° spatial sinc excitation pulse, and
  a second half of the sequence comprising:
    a second tip-down −90°, $90_{60}180_{60}$ composite excitation pulse that is an amplitude-negated version of the first tip-down 90° composite excitation pulse,
    a second 180° orthogonal hard refocusing excitation pulse,
    and a second tip-up spatially and spectrally selective 90° spatial sinc excitation pulse that is an amplitude-negated version of the first tip-up selective −90° spatial sinc excitation pulse.

2. The method of claim 1 wherein the first tip-up pulse is a spectral-spatial pulse with sinc envelope and sinc subpulses, and the second tip-up pulse is a spectral-spatial pulse with sinc envelope and sinc subpulses.

3. A non-transitory, tangible, computer-readable storage medium containing a program of instructions that cause an MRI scanner to implement the method of claim 1.

* * * * *